United States Patent
Sugawara

(10) Patent No.: US 7,465,959 B2
(45) Date of Patent: Dec. 16, 2008

(54) SEMICONDUCTOR LIGHT EMITTING DEVICE, SEMICONDUCTOR LIGHT EMITTING APPARATUS, AND METHOD OF MANUFACTURING SEMICONDUCTOR LIGHT EMITTING DEVICE

(75) Inventor: Yasuharu Sugawara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/137,562

(22) Filed: May 26, 2005

(65) Prior Publication Data
US 2006/0197094 A1 Sep. 7, 2006

(30) Foreign Application Priority Data
Mar. 4, 2005 (JP) .............................. 2005-060276

(51) Int. Cl.
*H01L 33/00* (2006.01)
(52) U.S. Cl. .................... 257/95; 257/98; 257/E33.006
(58) Field of Classification Search .................... 257/98, 257/95
See application file for complete search history.

(56) References Cited
U.S. PATENT DOCUMENTS 5,869,848 A * 2/1999 Nobori et al. ................. 257/95
6,791,119 B2 * 9/2004 Slater et al. ................... 257/99
2004/0026700 A1 2/2004 Akaike et al.
2004/0061120 A1 * 4/2004 Mizuyoshi ................... 257/79
2004/0262625 A1 * 12/2004 Baur et al. .................... 257/94
2005/0017250 A1 1/2005 Nitta et al.
2005/0253157 A1 * 11/2005 Ohashi et al. ................ 257/95

FOREIGN PATENT DOCUMENTS

| JP | 7-235690 | 9/1995 |
| JP | 10-200156 | 7/1998 |
| JP | 10-341035 | 12/1998 |

* cited by examiner

*Primary Examiner*—Jerome Jackson, Jr.
(74) *Attorney, Agent, or Firm*—Oblon, Spivak, McClelland, Maier & Neustadt, P.C.

(57) ABSTRACT

Disclosed is a semiconductor light emitting device comprising: a substrate having first and second major surfaces and being translucent to light in a first wavelength band; and a semiconductor stacked body provided on the first major surface and including a light emitting layer that emits light in the first wavelength band. A side face of the substrate has a recess. A cross section located between the first and second major surfaces is substantially smaller than the first and second major surfaces.

16 Claims, 10 Drawing Sheets

SEMICONDUCTOR LIGHT EMITTING DEVICE, SEMICONDUCTOR LIGHT EMITTING APPARATUS, AND METHOD OF MANUFACTURING SEMICONDUCTOR LIGHT EMITTING DEVICE

CROSS-REFERENCE TO RELATED APPLICATIONS

This application is based upon and claims the benefit of priority from the prior Japanese Patent Application No. 2005-060276, filed on Mar. 4, 2005; the entire contents of which are incorporated herein by reference.

BACKGROUND OF THE INVENTION

This invention relates to a semiconductor light emitting device, a semiconductor light emitting apparatus, and a method of manufacturing a semiconductor light emitting device, and more particularly to a semiconductor light emitting device and a method of manufacturing the same in which the external light extraction efficiency is improved.

There is an increasing demand for higher brightness of semiconductor light emitting apparatuses in various applications such as backlights of liquid crystal displays, push button lamps of mobile phones, and lighting substituted for fluorescent lamps. In order to obtain high brightness while reducing power consumption, it is important to improve the external light extraction efficiency of a semiconductor light emitting device.

In a semiconductor light emitting device, the light emitted from its active layer can be extracted outside without multiple reflection only when the incident angle to the radiating surface is smaller than the critical angle. A semiconductor light emitting device having an radiating surface made of GaP (having a refractive index of about 3.3) and sealed in epoxy-based sealing resin (having a refractive index of about 1.5) has a critical angle of about 27 degrees. The light having an incident angle greater than the critical angle at the side face of the semiconductor light emitting device is either radiated outside after multiple reflection inside the device, or absorbed inside to result in ineffective light.

A structure for improving the external light extraction efficiency of a semiconductor light emitting device is disclosed in which the semiconductor light emitting device has an inclined side face to reduce the incident angle inside the device from the light emitting layer to the side face of the device, thereby reducing the influence of total reflection at the side face of the semiconductor light emitting device (e.g., Japanese Laid-Open Patent Application 2003-188410).

SUMMARY OF THE INVENTION

According to an aspect of the present invention, there is provided a semiconductor light emitting device comprising:

a substrate having first and second major surfaces and being translucent to light in a first wavelength band; and a semiconductor stacked body provided on the first major surface and including a light emitting layer that emits light in the first wavelength band, a side face of the substrate having a recess, and a cross section located between the first and second major surfaces being substantially smaller than the first and second major surfaces.

According to other aspect of the present invention, there is provided a semiconductor light emitting apparatus comprising:

a packaging member;

a semiconductor light emitting device mounted on the packaging member; and sealing resin sealing the semiconductor light emitting device, the semiconductor light emitting device including:

a substrate having first and second major surfaces and being translucent to light in a first wavelength band; and a semiconductor stacked body provided on the first major surface and including a light emitting layer that emits light in the first wavelength band, a side face of the substrate having a recess, and a cross section located between the first and second major surfaces being substantially smaller than the first and second major surfaces.

According to other aspect of the present invention, there is provided a method of manufacturing a semiconductor light emitting device comprising:

forming, on a first major surface of a substrate having first and second major surfaces and being translucent to light in a first wavelength band, a semiconductor stacked body including a light emitting layer that emits light in the first wavelength band;

forming a reformed layer inside the substrate by moving a laser beam relative to the substrate while converging and applying the laser beam to the substrate to cause multiphoton absorption near a focus;

separating the substrate along the reformed layer; and etching away the reformed layer exposed at a side face in response to separation of the substrate to form a recess.

DETAILED DESCRIPTION OF THE INVENTION

Embodiments of the invention will now be described with reference to the drawings.

Figure 1:
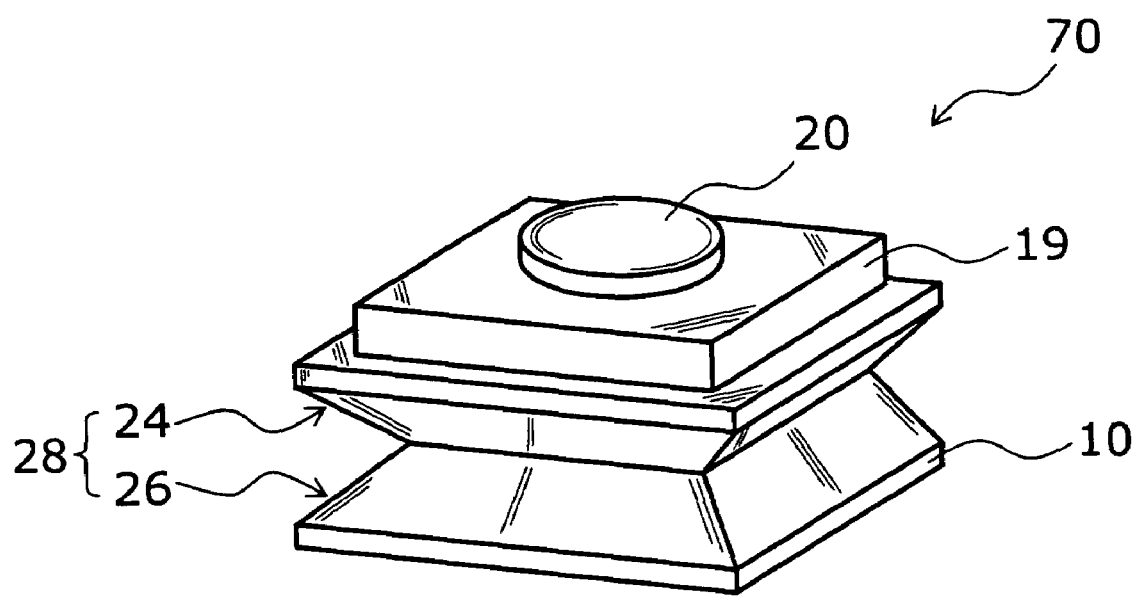
FIG. 1 is a schematic perspective view of a semiconductor light emitting device according to a first embodiment of the invention as viewed from obliquely above.
Figure 2:
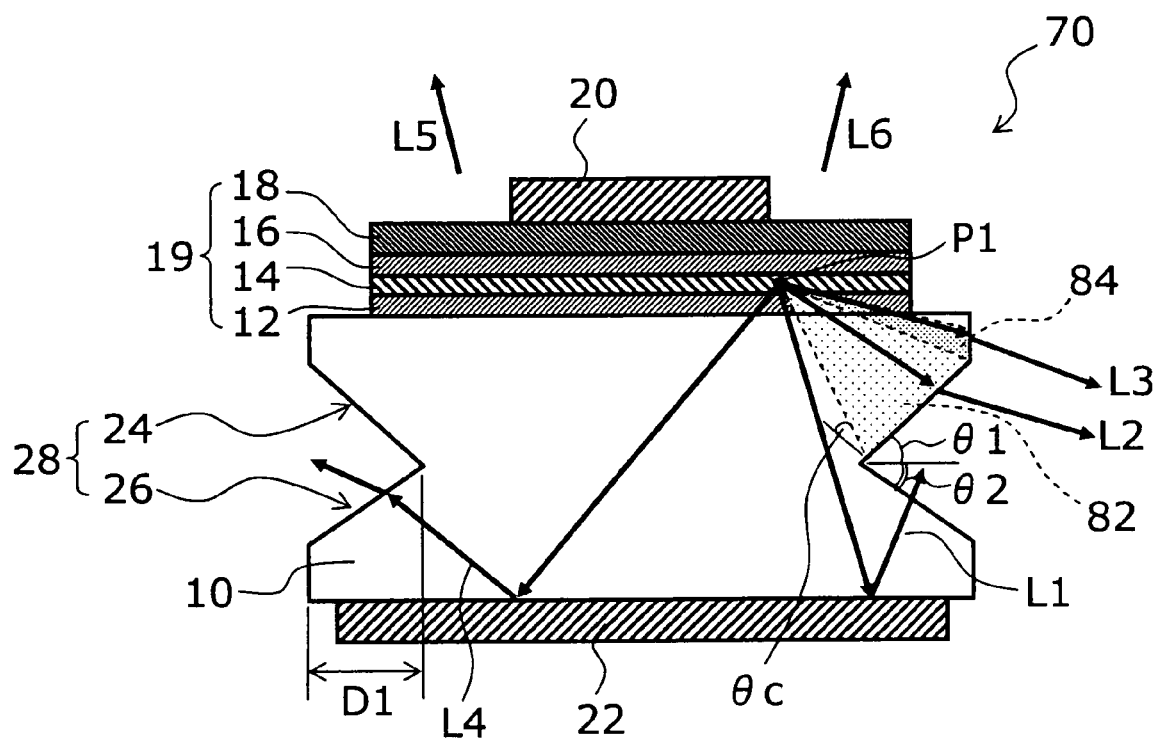
FIG. 2 is a schematic cross-sectional view of a semiconductor light emitting device according to the first embodiment of the invention.

FIGS. 1 and 2 are schematic views illustrating a semiconductor light emitting device according to a first embodiment of the invention. More specifically, FIG. 1 is a schematic perspective view of a semiconductor light emitting device according to this embodiment as viewed from obliquely above. FIG. 2 is a schematic view illustrating the cross-sectional structure of a semiconductor light emitting device according to this embodiment.

The semiconductor light emitting device 70 of this embodiment has a structure comprising a substrate 10 transparent to the light radiated from the semiconductor light emitting device 70 (the term "transparent" used herein is intended to imply not only no absorption of light emitted from the light emitting layer, but also partial transmission of the light with some absorption) on which a semiconductor stacked body 19 including an active layer 14 (i.e., the light emitting layer) is formed. An upper electrode 20 is provided on top of the semiconductor stacked body 19. On the other hand, as illustrated in FIG. 2, a lower electrode 22 is provided under the transparent substrate 10. It should be noted that the lower electrode 22 is not shown in FIG. 1 because it is hidden under the transparent substrate 10.

The semiconductor stacked body 19 has a structure comprising, for example, a first cladding layer 12 on which the active layer 14, a second cladding layer 16, and a current diffusion layer 18 are stacked in this order.

A recess 28 is formed on the side face of the transparent substrate 10 of the semiconductor light emitting device 70 according to this embodiment. The recess 28 is provided so that the cross section located between the upper and lower major surfaces of the transparent substrate 10 is substantially smaller than these upper and lower major surfaces. In an example shown in FIGS. 1 and 2, the recess 28 is composed of a first plane 24 extending obliquely downward and a second plane 26 extending obliquely upward. Part of the light emitted from the active layer 14 that is directed to the underlying transparent substrate 10 is radiated outside from the side face of the transparent substrate 10. In this case, since the recess 28 is formed on the side face, more of the light emitted from the active layer 14 is extracted outside through the recess 28. The recess 28 serves to improve the light extraction efficiency as described later in detail.

Next, components of the semiconductor light emitting device of this example will be described more specifically.

The transparent substrate 10 is selected to be made of n-type GaP material, for example. The first cladding layer 12 is selected to be an n-type InAlP film, the active layer 14 is an InGaAlP film, the second cladding layer 16 is a p-type InAlP film, and the current diffusion layer 18 is a p-type GaP film. These constitute the semiconductor stacked body 19. A p-type, upper electrode 20 (made of Au, Au alloy, or the like) is formed partially on top of the current diffusion layer 18. An n-type, lower electrode 22 (made of Au, Au alloy, or the like) is formed partially on the lower side of the transparent substrate 10. The lower electrode 22 is mounted, for example, on a lead of a package using AuSn solder, silver paste, or the like.

The semiconductor stacked body 19 and the transparent substrate 10 are bonded together by the wafer bonding process and the like. In this case, preferably, a bonding layer made of GaP or the like is provided therebetween. In addition, a contact layer can be provided between the current diffusion layer 18 and the upper electrode 20 to further reduce the contact resistance.

Visible light is emitted from the InGaAlP active layer 14. Since absorption of visible light within the GaP substrate is as small as 20% or less, a higher external light extraction efficiency is obtained as compared to the GaAs substrate.

The foregoing refers to an example of $In_xGa_yAl_{1-x-y}P$-based material (where $(x+y) \leq 1$, $0 \leq x \leq 1$, $0 \leq y \leq 1$). In addition, for example, $In_zGa_wAl_{1-z-w}N$-based material (where $(z+w) \leq 1$, $0 \leq z \leq 1$, $0 \leq w \leq 1$) or the like may be used. Sapphire or the like may also be used for the transparent substrate.

Next, the effect of the recess 28 will be described with reference to FIG. 2 using the light emitted from point P1 in the active layer 14 as an example. In this figure, arrows L5 and L6 represent the light directly radiated upward (i.e., light extraction side) from the active layer 14.

Light L1 from the light emitting point P1 is reflected by the lower electrode 22 and incident on the second plane 26. The light L1 having an incident angle smaller than the critical angle θc is not reflected by the second plane 26 and becomes radiated light.

Light L2 incident on the first plane 24 becomes direct emission light when its incident angle is smaller than the critical angle θc. The term "direct emission light" used herein refers to the light that is emitted from the active layer 14, passed through the transparent substrate 10, and directly radiated outside. That is, the light is directly radiated outside without being reflected within the chip by the side face and lower face of the transparent substrate 10, the lower electrode 22, and the like. The region where direct emission occurs is referred to as "direct emission region" 82, and illustrated by dots. Similarly, a direct emission region 84 is illustrated by dots where direct emission, as typified by light L3, occurs between the first plane 24 and the semiconductor stacked body 19. In the vicinity of the lower electrode 22, alloying between the electrode metal 22 and the transparent substrate 10 results in some decrease of reflectance. However, our prototypes exhibited a reflectance of about 50%. When the transparent substrate 10 is made of GaP (having a refractive index of about 3.3) and the semiconductor light emitting device 70 is sealed in epoxy resin (having a refractive index of about 1.5), the critical angle θc is about 27 degrees.

On the other hand, light L4 emitted from the light emitting point P1 and reflected by the lower electrode 22 is radiated from the second plane 26 of another recess 28. When the depth D1 of the recess 28 is increased, the light reflected by the lower face of the transparent substrate 10 and then radiated outside (e.g., light L1) is decreased while the light directly radiated from the recess 28 (e.g., light L2) is increased. The depth D1 of the recess 28 can be appropriately determined to increase the external light extraction efficiency and to maintain the mechanical strength of the chip. As an example, in a transparent substrate 10 measuring 150 to 1000 micrometers per side, the depth D1 desirably ranges from 2 to 100 micrometers. Relevant structural parameters include the size of the active layer 14, the distance between the active layer 14 and the substrate, and the thickness of the substrate. It is thus desirable to determine the shape of the recess 28 (including the depth D1) based on simulations or experiments. According to prototyping by the inventor, the angle θ1 between the first plane 24 and the horizontal plane desirably ranges from 10 to 80 degrees. On the other hand, the angle θ2 between the second plane 26 and the horizontal plane desirably ranges from 10 to 80 degrees.

Next, the effect of the recess 28 in this embodiment will be described in more detail with reference to a comparative example investigated by the inventor.

Figure 3:
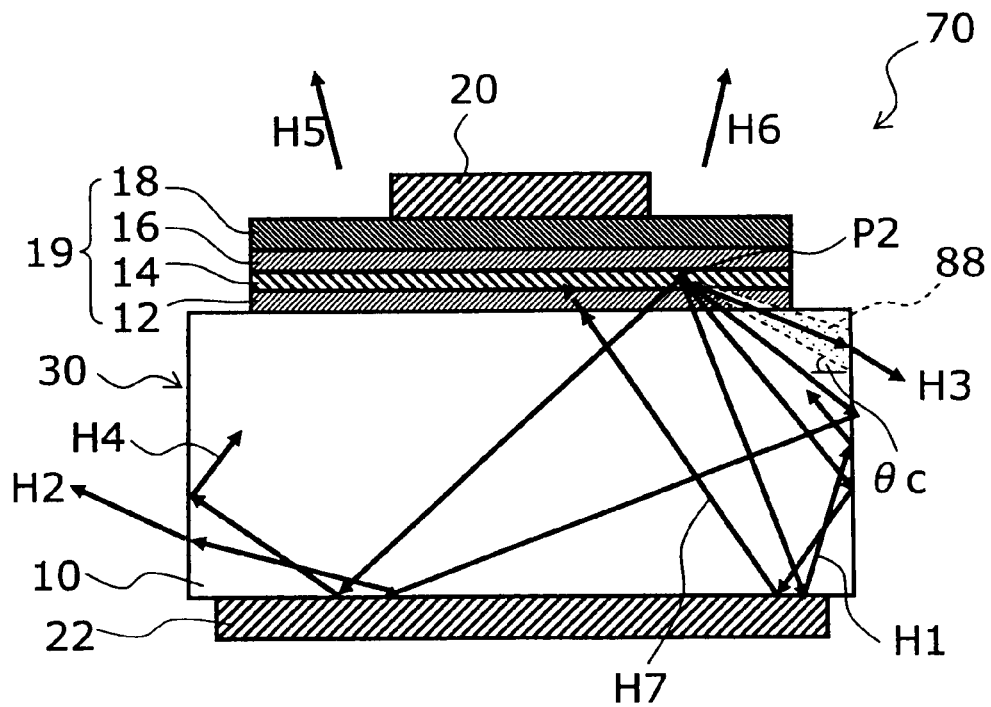
FIG. 3 is a schematic cross-sectional view of a semiconductor light emitting device of a comparative example.

FIG. 3 is a schematic cross-sectional view of a semiconductor light emitting device 70 of a comparative example. With regard to this figure, the elements similar to those described above with reference to FIGS. 1 and 2 are marked with the same reference numerals and will not be described in detail. The transparent substrate 10 of this comparative example has a side face composed of four planes vertical to the lower electrode 22.

When the transparent substrate 10 is made of GaP and the semiconductor light emitting device 70 is sealed in epoxy-based resin, the critical angle θc is about 27 degrees. In FIG. 3, the light H5 and H6 represent direct emission light from the active layer 14.

In the direct emission region 88 where the incident angle to the vertical side face 30 is smaller than the critical angle θc, light H3 from point P2 is directly radiated outside. On the other hand, light H1 is reflected by the lower electrode 22 and then incident on the vertical side face 30. In this situation, the light having an incident angle greater than the critical angle θc is totally reflected by the vertical side face 30 as illustrated in FIG. 3. Then the light has an increased optical length due to multiple reflection and is incident on the active layer 14 to increase optical absorption, which decreases the amount of light that can be extracted outside. In contrast, the light L1 in the first embodiment, as compared to the light H1, is radiated from the recess 28.

Moreover, light H7 incident on the vertical side face 30 at an angle greater than the critical angle is totally reflected, and further reflected by the lower electrode 22 (double reflection). If it returns to the active layer 14, the amount of light that can be extracted is decreased due to absorption by the active layer 14. Light H2, which has an incident angle greater than the critical angle θc and smaller than that of the light H7 is totally reflected by the vertical side face 30, further reflected by the lower electrode 22, and incident on another vertical side face 30. Then, if the incident angle is smaller than the critical angle θc, the light is radiated outside as illustrated in FIG. 3. In this case, the light is subjected to double reflection inside, and particularly to optical absorption by reflection at the lower electrode 22. In contrast, the light L2 in the first embodiment, as compared to the light H2, is direct emission light without double reflection.

Furthermore, light H4 is reflected by the lower electrode 22, and further totally reflected by the vertical side face 30 toward the inside of the chip. As a result, part of the light is difficult to extract outside. In contrast, the light L4 in the first embodiment, as compared to the light H4, is radiated outside from the recess 28, although it is reflected once by the lower electrode 22.

In general, optical loss in a semiconductor light emitting device is caused by reabsorption in the active layer, absorption by the alloy layer in the electrode region, intracrystalline absorption including free carrier absorption in the doped region, and the like. Therefore, while the direct emission light without internal reflection involves a small loss, any reflection increases the loss as described above. That is, multiple reflection decreases the external light extraction efficiency by the above causes in conjunction with the increase of optical length.

In addition, if the light is subjected to many internal reflections, it is radiated in directions different from the light extraction side. Therefore, often, the light cannot be effectively extracted outside the finally packaged semiconductor light emitting apparatus.

As described above, in the comparative example illustrated in FIG. 3, total reflection occurs in a wide area of the side face of the device. On the contrary, in the first embodiment where, for example, recesses 28 having a depth D1 of 2 micrometers or greater are formed, the area of causing total reflection can be reduced on the side face of the device. As a result, the direct emission light can be increased. In addition, the number of multiple reflections inside the semiconductor light emitting device can be reduced, which in turn can reduce optical absorption. Consequently, in a semiconductor light emitting apparatus using a surface mount package described below, the present embodiment achieves an external light extraction efficiency of 1.4 to 1.7 times greater as compared to the apparatus using the semiconductor light emitting device of the comparative example illustrated in FIG. 3. Moreover, the inclined side face is limited to the recess 28 having depth D1, which enables improvement of external light extraction efficiency without increasing the chip size. In other words, the light extraction efficiency can be improved while maintaining the total number of chips per wafer at the level in the case of rectangular chips.

This embodiment has another advantageous effect that the area of the upper and lower faces of the semiconductor light emitting device can be made substantially equal.

More specifically, the light emitting diode chip disclosed in Japanese Laid-Open Patent Application 2003-188410 cited above as a comparative example has inclined side faces to be shaped as a truncated pyramid in order to improve light extraction efficiency. However, in the structure of this comparative example, the area of the horizontal plane above the inclined side face is smaller than the area of the bottom face below the side face. Since the area of the electrode provided on the upper face has a lower bound in order to avoid increasing the contact resistance, the chip size for obtaining the same optical output is increased as compared to the structure in which the upper and lower faces have an equal area. This result in a problem of decreasing the total number of chips obtained per wafer. In addition, if the chip of this comparative example is mounted upside down, the area of the mounting surface is smaller than the area of the upper face of the device. Thus the decreased bonding area lowers the bonding strength and physical stability.

On the contrary, in the semiconductor light emitting device according to this embodiment, the upper and lower major surfaces of the device have a substantially equal area. Therefore, advantageously, the number of chips obtained per wafer is not decreased, and the device can be bonded in a stable and secure manner. As a result, the device can provide a thermally and mechanically superior structure and achieve higher reliability in spite of its inclined side faces.

Next, a semiconductor light emitting device according to the second embodiment will be described.

Figure 4:
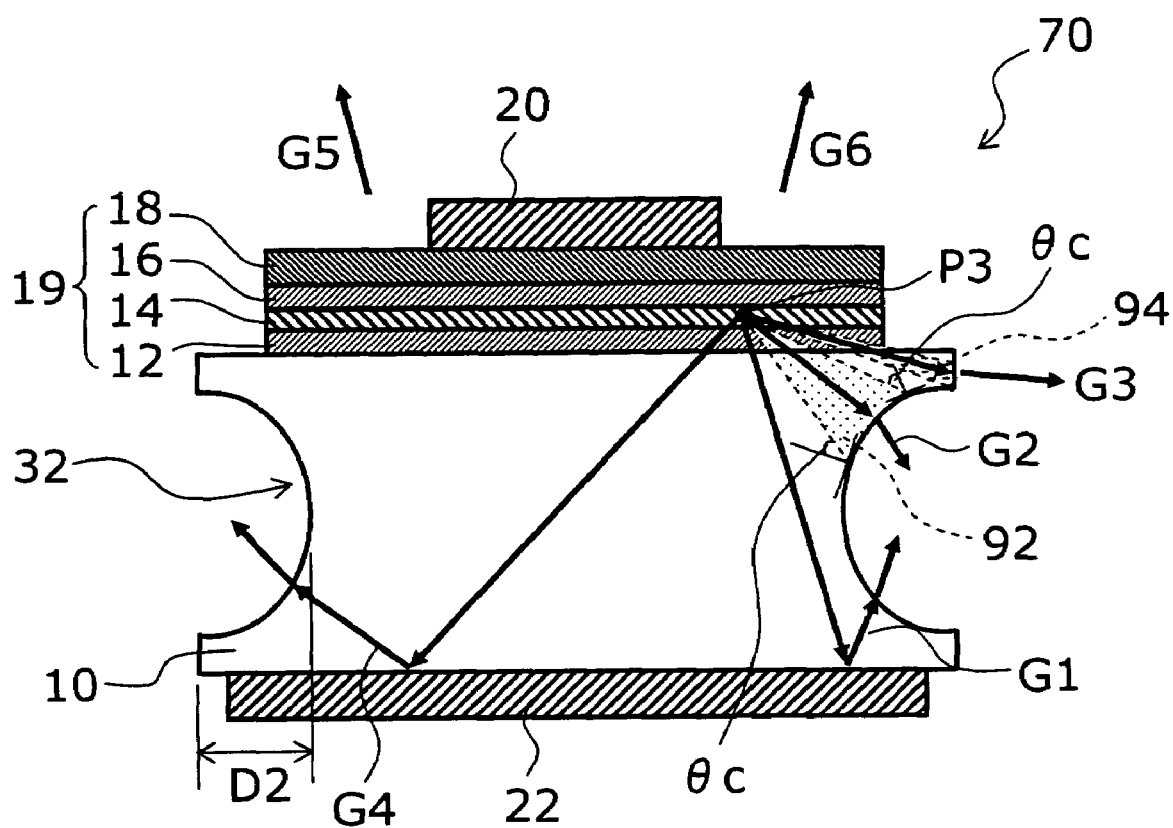
FIG. 4 is a schematic cross-sectional view of a semiconductor light emitting device according to a second embodiment of the invention.

FIG. 4 is a schematic cross-sectional view of a semiconductor light emitting device 70 according to the second embodiment. With regard to this figure, the elements similar to those described above with reference to FIGS. 1 and 2 are marked with the same reference numerals and will not be described in detail.

In this embodiment, the side face of the transparent substrate 10 has a curved recess 32. Again, the recess 32 is provided so that the cross section located between the upper and lower major surfaces of the transparent substrate 10 is substantially smaller than these upper and lower major surfaces. The curved recess 32 is composed of a curve concave on the outside in the cross section shown in FIG. 4. Specific examples include semielliptic and semicircular cylinder surfaces. In this case again, for example, the transparent substrate 10 may be made of n-type GaP, and the semiconductor light emitting device 70 may be sealed in epoxy resin.

Light G5 and G6 from light emitting point P3 in the active layer 14 are direct emission light from the active layer 14. Light G1 from the light emitting point P3 is reflected by the lower electrode 22 and then radiated outside from the recess 32. In the recess 32, incident light such as light G2 is directly radiated outside in the direct emission region 92 marked with dots where the incident angle to the tangent plane at an incident point on the recess 32 is smaller than the critical angle θc. In the direct emission region 94 marked with dots between the recess 32 and the semiconductor stacked body 19, light G3 having an incident angle smaller than the critical angle θc is directly radiated outside.

Light G4 from the light emitting point P3 is reflected by the lower electrode 22 and then radiated outside from another recess 32. The effect of the curved recess 32 shown in FIG. 4 is understood similarly to that of the planar recess 28 of the first embodiment.

The second embodiment can also expand the region where the light from the active layer 14 can be directly extracted outside without reflection (regions 92 and 94 illustrated by dots). Again, with respect to the light reflected by the lower electrode 22 (e.g., G4), the number of multiple reflections can be decreased. Consequently, the present embodiment achieves an external light extraction efficiency of 1.4 to 1.7 times that of the comparative example. In addition, as with the first embodiment, the light extraction efficiency can be improved without increasing the chip size. Moreover, in the second embodiment, the recess 32 is composed of a curved surface. As a result, the radiation angle of light can be continuously varied. Therefore the directional characteristics of the semiconductor light emitting apparatus can be smoothly varied.

In a transparent substrate 10 measuring 150 to 1000 micrometers per side, the depth D2 of the recess 32 desirably ranges from 2 to 100 micrometers.

Next, the method of manufacturing a semiconductor light emitting device according to the second embodiment will be described.

FIGS. 5 to 10 are process cross-sectional views showing the method of manufacturing a semiconductor light emitting device of this embodiment.

Figure 5:
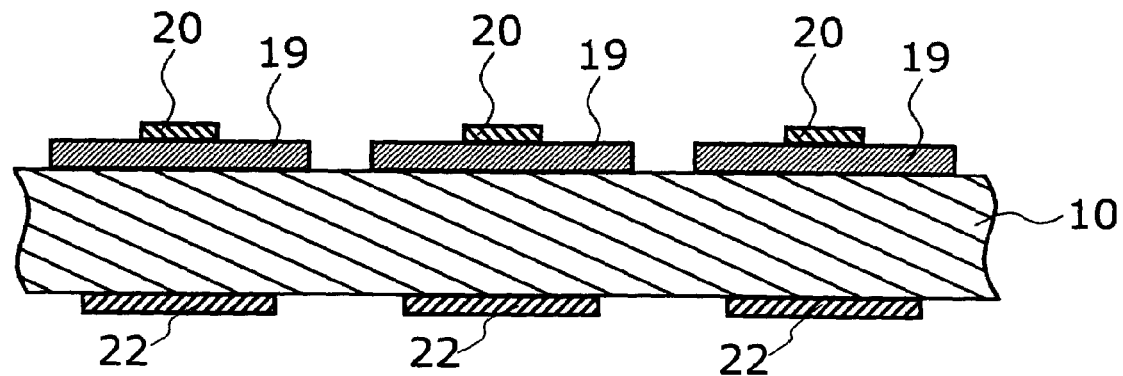
FIGS. 5 to 10 are process cross-sectional views showing a process of manufacturing a semiconductor light emitting device according to the second embodiment of the invention.

FIG. 5 is a schematic cross-sectional view at the end of the wafer process. A semiconductor stacked body 19 including an active layer 14 (i.e., light emitting layer) is provided on a transparent substrate 10 by crystal growth or bonding. Subsequently, an upper electrode 20 and a lower electrode 22 are patterned on the upper face of the semiconductor stacked body 19 and on the lower face of the transparent substrate 10, respectively. In addition, part of the semiconductor stacked body 19 is etched by wet etching, RIE (Reactive Ion Etching), or the like to separate individual chips, which completes the wafer process.

Next, the semiconductor stacked body 19 and the upper electrode 20 are covered with mask material 40 such as resist. Then, for example, it is three-dimensionally scanned with a beam 46 of a short-pulse-driven high power laser such as a femtosecond laser.

Figure 6:
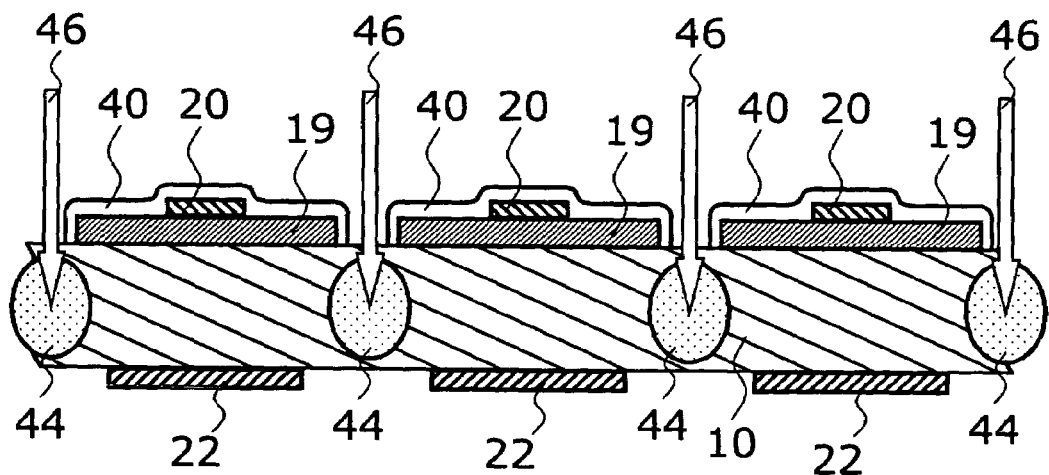

FIG. 6 is a schematic cross-sectional view of the transparent substrate 10 in which first reformed layers 44 are formed by three-dimensionally scanning the region to be served as a recess. When the transparent substrate 10 in the semiconductor light emitting device 70 measures 150 to 1000 micrometers per side, the size of the first reformed layer 44 can be selected within the range of a vertical length of 2 to 150 micrometers and a horizontal width of 4 to 200 micrometers.

Figure 11:
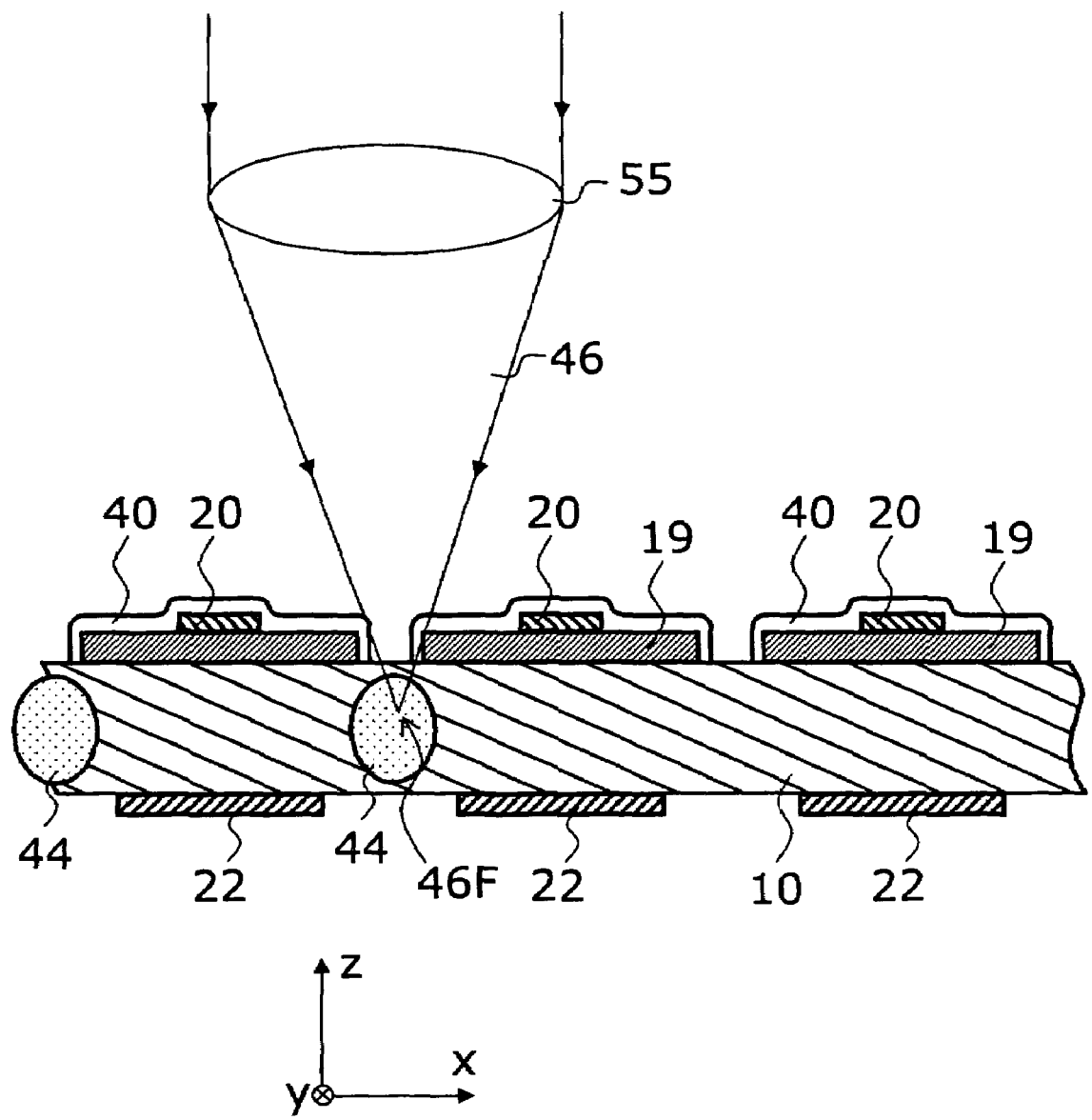
FIG. 11 is a schematic view showing the process of forming a reformed layer 44 in more detail.

FIG. 11 is a schematic view showing the process of forming a reformed layer 44 in more detail.

More specifically, laser light in a wavelength band to which the substrate 10 is generally transparent is converged by an optical system 55 to form a beam 46, which is focused at the inside of the substrate 10. This results in "multiphoton absorption", which is an optically damaging phenomenon that occurs when the intensity of laser light is extremely increased.

Typically, the multiphoton absorption phenomenon occurs even in transparent material when it is irradiated with a high-energy laser beam. This phenomenon causes variation in the internal structure of the material, such as weakening the internal bonding of the crystal and changing the refractive index. As a result, the bonding in the crystal becomes fragile at the focus 46F of the high-energy laser beam.

The transparent substrate 10 can be scanned with the laser beam 46 three-dimensionally in X, Y, and Z directions to move the laser beam focus 46F in the transparent substrate 10. This can cause optical damage to a desired region to form a first reformed layer 44.

Figure 7:
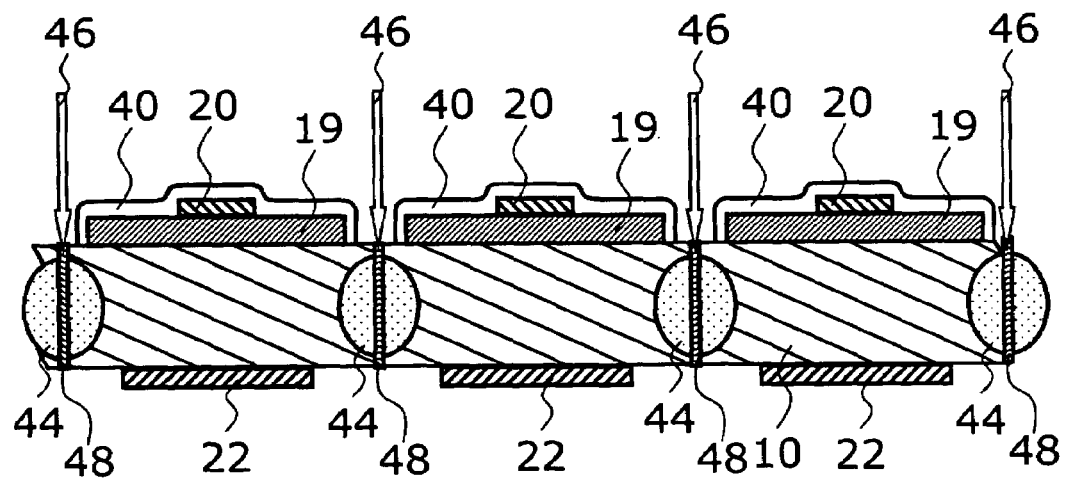

After the first reformed layer 44 is formed, as illustrated in FIG. 7, the region to be served as a dicing line for separating chips is three-dimensionally scanned with the beam 46 in a similar manner to form a second reformed layer 48. Here again, the substrate 10 can be successively irradiated with the converged laser beam to cause optical damage and thereby form the second reformed layer 48.

The second reformed layer 48 is formed nearly through the transparent substrate 10, and its width can be selected within the range of 1 to 50 micrometers. Therefore the dicing width can be reduced as compared to that in the blade dicing process.

Figure 8:
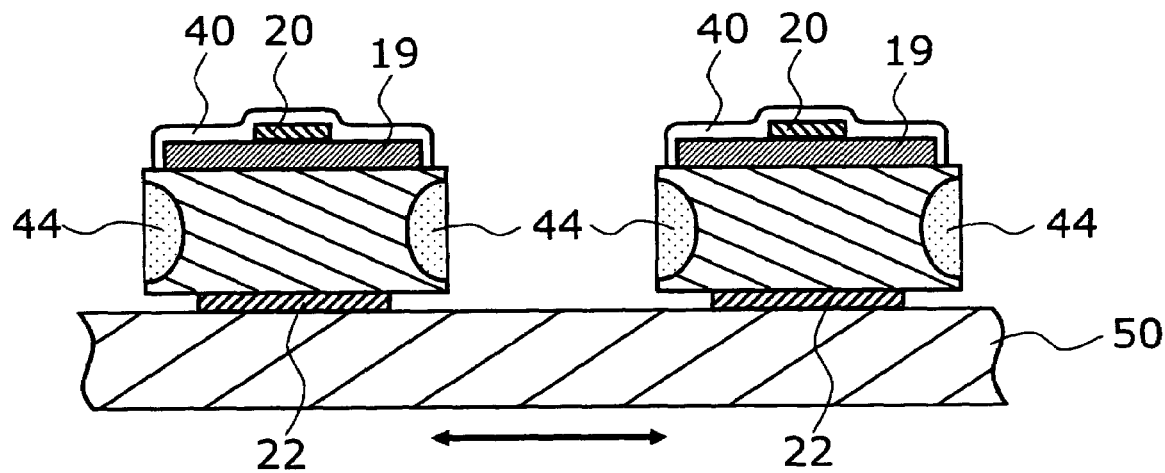

Subsequently, as illustrated in FIG. 8, an adhesive tape 50 is stuck on the rear face of the wafer, and then the adhesive tape 50 is stretched. Since the second reformed layer 48 is made fragile, the wafer is separated into individual semiconductor light emitting devices 70 by the stretching action.

The first reformed layer 44 exposed on the side face of the substrate 10 at this time is fragile similarly to the second reformed layer 48, and thus has a faster etching rate than the other regions. Therefore, for example, chemical including hydrochloric acid, sulfuric acid, or hydrofluoric acid, or its mixture with hydrogen peroxide can be used for wet etching to selectively remove the reformed layers 44 and 48, thereby forming the recess 32.

Instead of the wet process, a dry etching process such as CDE (Chemical Dry Etching) may also be used to form the recess 32.

Instead of forming the reformed layer by laser beam scanning, a bowing process by RIE may also be used to form a curved recess 32. However, if the reformed layer 44 is not formed, the cross-sectional shape of the recess 32 is controlled by the chemical reaction during the bowing process. This makes the shape control slightly difficult.

Figure 10:
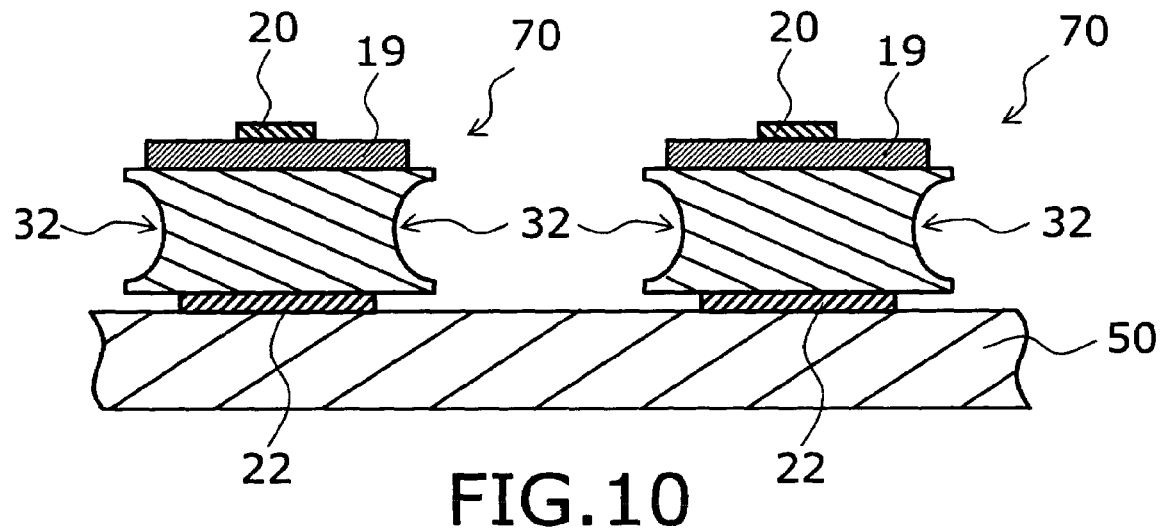

Finally, as illustrated in FIG. 10, the mask material 40 is peeled off, and then the adhesive tape 50 is removed. As a result, a semiconductor light emitting device 70 is obtained.

In the above process illustrated in FIGS. 6 to 10, the mask material 40 is provided to cover the semiconductor stacked body 19, and the adhesive tape 50 is stuck on the opposite side of the transparent substrate 10. Conversely, the adhesive tape 50 may be stuck to cover the semiconductor stacked body 19, and the mask material 40 may be provided on the opposite side of the transparent substrate 10. In this case, the laser beam 46 is applied on the opposite side of the semiconductor stacked body 19.

According to the manufacturing method of this embodiment, the region to be served as a recess can be scanned with the laser beam directly in a wafer. As a result, the recess 32 of a desired shape can be formed in a controllable and productive manner. In addition, the recess 28 of the semiconductor light emitting device 70 of the first embodiment illustrated in FIG. 1 can be similarly formed by controlling the scanning of the laser beam 46.

Next, a semiconductor light emitting device according to a third embodiment of the invention will be described.

Figure 12:
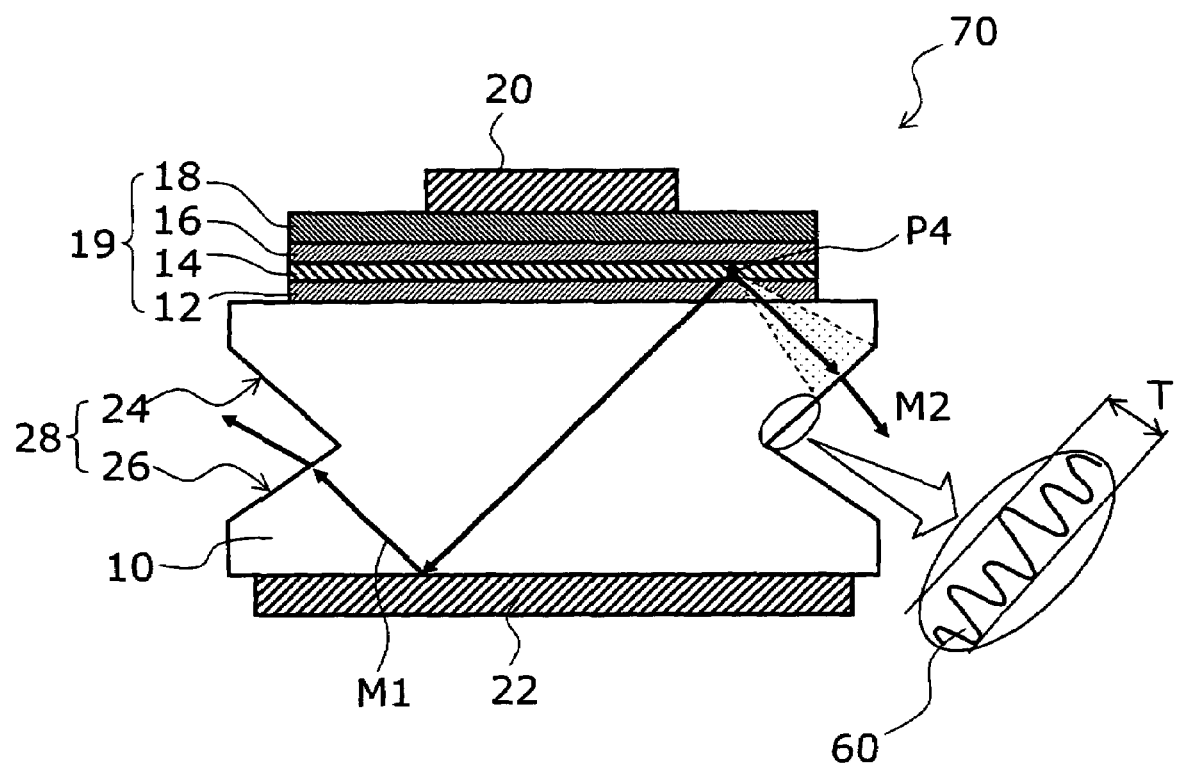
FIG. 12 is a schematic cross-sectional view of a semiconductor light emitting device according to a third embodiment of the invention.

FIG. 12 is a schematic cross-sectional view showing a semiconductor light emitting device 70 according to the third embodiment. With regard to this figure, the elements similar to those in the semiconductor light emitting device illustrated in FIG. 2 are marked with the same reference numerals and will not be described in detail.

In the third embodiment, a rough surface 60 of minute asperities is provided on the surface of the recess 28. More specifically, in FIG. 12, a rough surface 60 of asperities having an altitude difference T is provided on at least a portion of at least one of the first plane 24 and the second plane 26. An example of the rough surface 60 is illustrated in FIG. 12 in a partially enlarged view. As a supplementary remark with regard to the upper bound of the altitude difference T, the depth D1 of the recess 28 is selected as an upper bound because asperities can be formed if they are smaller than the depth D1.

In FIG. 12, the region in which the light emitted from light emitting point P4 has an incident angle to the first plane 24 smaller than the critical angle θc is marked with dots. Without the rough surface 60 on the first plane 24, the light in this region is directly radiated without total reflection as illustrated by light M2. On the other hand, the light having an incident angle greater than the critical angle θc is totally reflected and returns inside the semiconductor light emitting device 70. However, the rough surface 60 provided on the first plane 24 can vary the incident angle. As a result, part of the light that would return inside without the rough surface 60 can be extracted outside by direct radiation, which can further improve the light extraction efficiency.

Similarly, a rough surface 60 provided on the second plane 26 can reduce the total reflection of light M1 emitted from the light emitting point P4. Furthermore, it is to be understood that such a rough surface 60 may be provided on the surface of the transparent substrate 10 other than the recess 28.

Next, a method of forming the rough surface 60 will be described.

Figure 9:
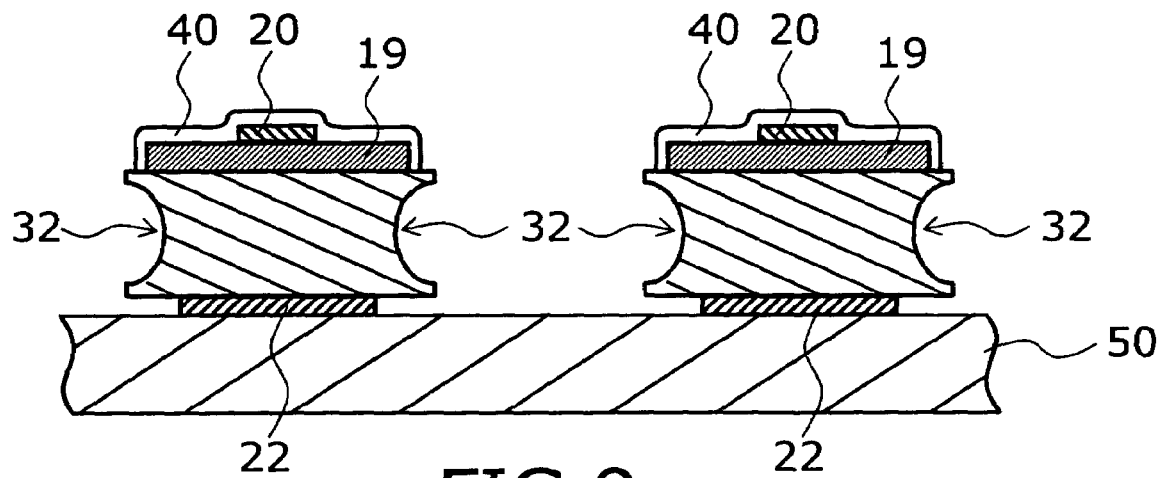

For example, after the recess 32 illustrated in FIG. 9 is formed, the substrate stuck to the adhesive tape 50 is immersed and shaken in HF (hydrofluoric acid) at a temperature of room temperature to 70° C. for several to ten-odd minutes to form a rough surface 60 (frosting). Alternatively, the rough surface 60 can also be formed using gas or solution containing fluorine. The asperities of the rough surface 60 formed by these methods have an altitude difference T of several nanometers to several micrometers. This can be smaller than the depth D1 of the planar recess 28 and the depth D2 of the curved recess 32, and can variously change the incident angle. For example, when the GaP substrate is etched using hydrofluoric acid, a rough surface 60 of pyramidal asperities having a width and height of generally 1 micrometer is formed. The rough surface 60 composed of a collection of such pyramids can increase the light extraction effect.

The third embodiment adds the improvement of light extraction efficiency achieved by the rough surface 60 of minute asperities as described above to the improvement of light extraction efficiency achieved by the recess of the first and second embodiments.

Next, a semiconductor light emitting device according to a fourth embodiment of the invention will be described.

Figure 13:
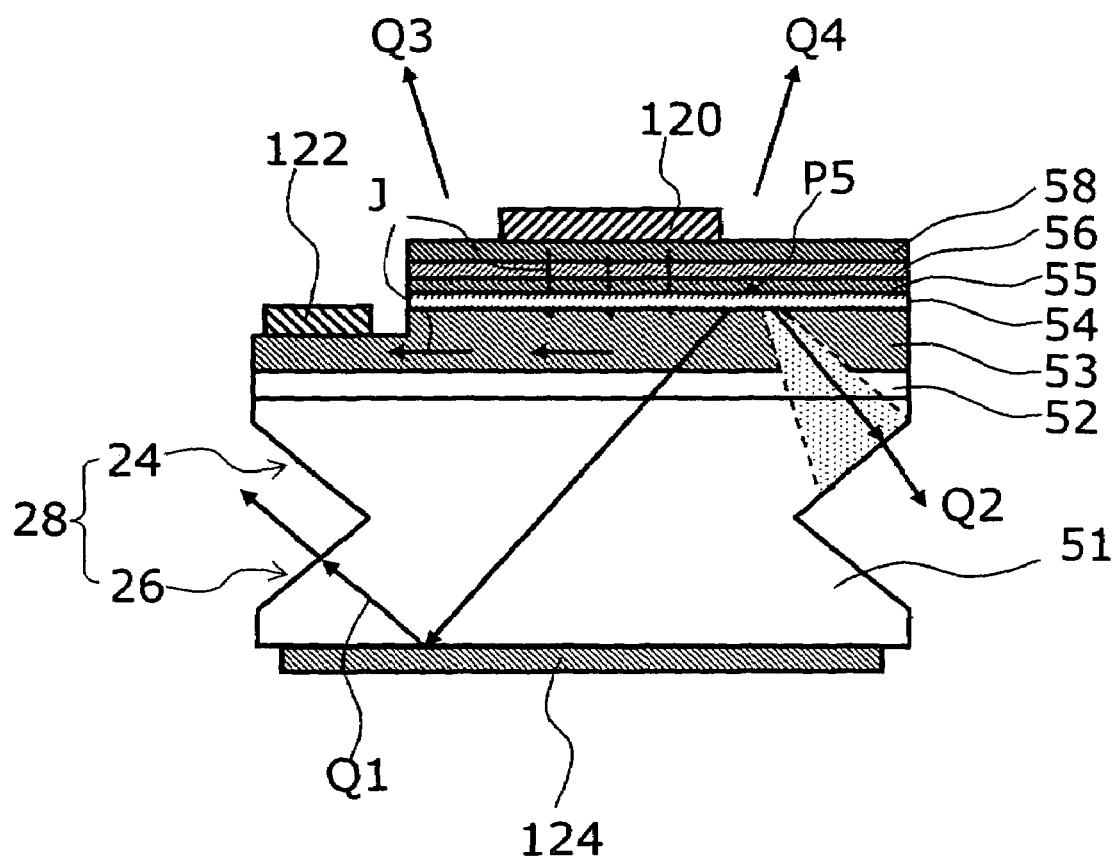
FIG. 13 is a schematic cross-sectional view of a semiconductor light emitting device according to a fourth embodiment of the invention.

FIG. 13 is a schematic cross-sectional view showing a semiconductor light emitting device 70 of this example. The semiconductor light emitting device 70 is a gallium nitride based light emitting device in which a sapphire substrate 51 is used for the transparent substrate. A GaN buffer layer 52, n-type GaN layer 53, n-type GaN guide layer 54, active layer 55, p-type GaN guide layer 56, and p-type GaN layer 58 are grown in this order on the sapphire substrate 51 by, for example, the MOCVD method. A p-type electrode 120 and an n-type electrode 122 are formed on the p-type GaN layer 58 and n-type GaN layer 53, respectively. Moreover, a reflector 124 for reflecting the light emitted from the active layer is provided on the lower face of the sapphire substrate 51. A recess 28 is formed on the side face of the sapphire substrate 51 using a process similar to that in the first to third embodiments. In this example, the driving current J of the semiconductor light emitting device flows between the p-type electrode 120 and the n-type electrode 122, and therefore does not flow in the sapphire substrate 51.

In FIG. 13, light Q2 emitted from light emitting point P5 having an incident angle to the first plane 24 smaller than the critical angle θc is directly radiated outside. Light Q1 reflected by the reflector 124 is directly radiated outside from the second plane 26. As a result, the light extraction efficiency can be improved without increasing the chip size.

Next, a semiconductor light emitting apparatus using the semiconductor light emitting device according to the first to fourth embodiments will be described.

Figure 14:
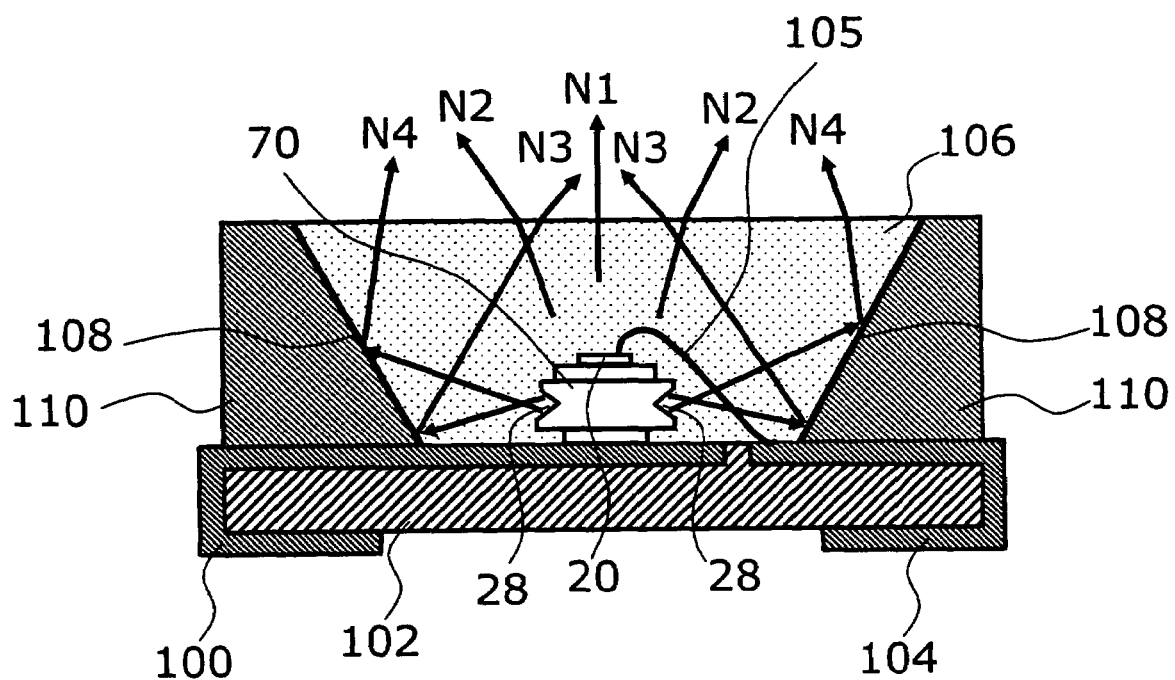
FIG. 14 is a schematic cross-sectional view of a semiconductor light emitting apparatus using a semiconductor light emitting device according to the first embodiment of the invention.

FIG. 14 is a schematic cross-sectional view of a semiconductor light emitting apparatus according to the first embodiment.

The semiconductor light emitting device 70 is, for example, the semiconductor light emitting device 70 according to the first to third embodiments. FIG. 14 illustrates use of the semiconductor light emitting device 70 according to the first embodiment. A first lead 100 and an opposed second lead 104 are embedded in resin 102 and 110. The semiconductor light emitting device 70 is bonded on the first lead 100 using, for example, AuSn solder, silver paste, or the like (not shown). The upper electrode 20 provided on the semiconductor light emitting device 70 is connected to the second lead 104 via a bonding wire 105 such as Au wire. The semiconductor light emitting device 70 and the bonding wire 105 are sealed with sealing resin 106 such as epoxy-based resin or silicone resin. A reflector 108 is formed at the interface between the resin 110 and the sealing resin 106. This structure is called Surface Mount Device (SMD), which allows high density packaging on a mounting board.

Light N1 and N2 are radiated approximately upward from the upper face of the semiconductor light emitting device 70. Light N3 radiated from the first plane 24 of the recess 28 of the semiconductor light emitting device 70 is reflected by the reflector 108, then refracted at the interface between the sealing resin 106 and air, and radiated. Light N4 from the second plane 26 is also reflected by the reflector 108, then refracted at the interface between the sealing resin 106 and air, and radiated. It is also the case when the recess is curved as illustrated in FIG. 4. The reflector 108 is provided by, for example, coating the surface of the resin 110 with metal having a high reflectance such as aluminum. The external light extraction efficiency of the semiconductor light emitting apparatus described above is 1.4 to 1.7 times greater as compared to the semiconductor light emitting apparatus using the semiconductor light emitting device 70 of the comparative example illustrated in FIG. 3.

Embodiments of the invention have been described with reference to specific examples. However, the invention is not limited to these specific examples.

For example, any structure, material, shape, thickness, and arrangement of various elements including the semiconductor stacked body, the recess on the side face, minute asperities, and the package composing the semiconductor light emitting device and semiconductor light emitting apparatus of the invention that are adapted by those skilled in the art based on known semiconductor light emitting devices and semiconductor light emitting apparatuses, are also encompassed within the scope of the present invention.

The invention claimed is:

1. A semiconductor light emitting device, comprising:
   a substrate having first and second major surfaces and being translucent to light in a first wavelength band; and
   a semiconductor stacked body provided on the first major surface and including a light emitting layer that emits light in the first wavelength band,
   a side face of the substrate having a recess,
   the recess extending in parallel to the first and second major surfaces,
   the recess being formed all around the substrate,
   a cross section located between the first and second major surfaces being smaller than the first and second major surfaces,
   the recess being composed of a combination of a first plane extending obliquely downward and a second plane extending obliquely upward, and
   the first and second major surfaces having an equal size.

2. A semiconductor light emitting device according to claim 1, wherein a rough surface is provided on at least a portion of the recess.

3. A semiconductor light emitting device according to claim 1, wherein the recess has a depth of 2 micrometers or greater.

4. A semiconductor light emitting device according to claim 1, wherein the first plane makes an angle of 10 to 80 degrees with the first major surface.

5. A semiconductor light emitting device according to claim 1, wherein the second plane makes an angle of 10 to 80 degrees with the first major surface.

6. A semiconductor light emitting device according to claim 1, wherein
   the substrate is made of GaP, and
   the light emitting layer is made of $In_xGa_yAl_{1-x-y}P$, where $0 \leq x \leq 1$, $0 \leq y \leq 1$, and $(x+y) \leq 1$.

7. A semiconductor light emitting device according to claim 1, wherein
   the substrate is made of sapphire, and
   the light emitting layer is made of $In_zGa_wAl_{1-z-w}N$, where $0 \leq z \leq 1$, $0 \leq w \leq 1$, and $(z+w) \leq 1$.

8. A semiconductor light emitting apparatus, comprising:
   a packaging member;
   a semiconductor light emitting device mounted on the packaging member; and
   sealing resin sealing the semiconductor light emitting device,
   the semiconductor light emitting device including:
      a substrate having first and second major surfaces and being translucent to light in a first wavelength band; and
      a semiconductor stacked body provided on the first major surface and including a light emitting layer that emits light in the first wavelength band,
      a side face of the substrate having a recess,
      the recess extending in parallel to the first and second major surfaces,
      the recess being formed all around the substrate,
      a cross section located between the first and second major surfaces being smaller than the first and second major surfaces,
      the recess being composed of a combination of a first plane extending obliquely downward and a second plane extending obliquely upward, and
      the first and second major surfaces having an equal size.

9. A semiconductor light emitting apparatus according to claim 8, further comprising a reflector configured to reflect light radiated from the recess.

10. A semiconductor light emitting apparatus according to claim 8, wherein the recess is composed of a curved surface.

11. A semiconductor light emitting apparatus according to claim 8, wherein a rough surface is provided on at least a portion of the recess.

12. A semiconductor light emitting device according to claim 1, wherein the side face of the substrate has a first surface which is provided between the recess and the first major surface, and is substantially perpendicular to the first major surface.

13. A semiconductor light emitting device according to claim 8, wherein the side face of the substrate has a first surface which is provided between the recess and the first major surface, and is substantially perpendicular to the first major surface.

14. A semiconductor light emitting device according to claim 12, wherein the side face of the substrate further has a second surface which is provided between the recess and the second major surface, and is substantially perpendicular to the second major surface.

15. A semiconductor light emitting device according to claim 13, wherein the side face of the substrate further has a second surface which is provided between the recess and the second major surface, and is substantially perpendicular to the second major surface.

16. A semiconductor light emitting device comprising:
   a substrate having first and second major surfaces and being translucent to light in a first wavelength band; and
   a semiconductor stacked body provided on the first major surface and including a light emitting layer that emits light in the first wavelength band,
   a side face of the substrate having a recess,
   the recess extending in parallel to the first and second major surfaces,
   the recess being formed all around the substrate,
   a cross section located between the first and second major surfaces being smaller than the first and second major surfaces,
   the recess is composed of a curved surface, and
   the first and second major surfaces having an equal size.

* * * * *